(12) United States Patent
Matsumoto et al.

(10) Patent No.: US 11,695,388 B2
(45) Date of Patent: Jul. 4, 2023

(54) ELASTIC WAVE DEVICE

(71) Applicant: Murata Manufacturing Co., Ltd., Nagaokakyo (JP)

(72) Inventors: Katsuya Matsumoto, Nagaokakyo (JP); Masato Nomiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1396 days.

(21) Appl. No.: 15/983,322

(22) Filed: May 18, 2018

(65) Prior Publication Data
US 2018/0269849 A1 Sep. 20, 2018

Related U.S. Application Data

(63) Continuation of application No. PCT/JP2016/083779, filed on Nov. 15, 2016.

(30) Foreign Application Priority Data

Dec. 21, 2015 (JP) ................................ 2015-248813

(51) Int. Cl.
| H03H 9/02 | (2006.01) |
| H03H 9/10 | (2006.01) |
| H03H 9/25 | (2006.01) |
| H03H 9/05 | (2006.01) |

(Continued)

(52) U.S. Cl.
CPC .... *H03H 9/02834* (2013.01); *H03H 9/02637* (2013.01); *H03H 9/0547* (2013.01); *H03H 9/1071* (2013.01); *H03H 9/1092* (2013.01); *H03H 9/145* (2013.01); *H03H 9/25* (2013.01); *H03H 9/6483* (2013.01); *H03H 9/02559* (2013.01)

(58) Field of Classification Search
CPC .. H03H 9/02; H03H 9/10; H03H 9/25; H03H 9/64
See application file for complete search history.

(56) References Cited

U.S. PATENT DOCUMENTS

| 5,237,235 | A | * | 8/1993 | Cho ................... H03H 9/02874 |
| | | | | 29/25.35 |
| 5,281,883 | A | * | 1/1994 | Ikata ................... H03H 9/1085 |
| | | | | 310/313 R |

(Continued)

FOREIGN PATENT DOCUMENTS

| JP | 2000-165192 A | 6/2000 |
| JP | 2003-087073 A | 3/2003 |

(Continued)

OTHER PUBLICATIONS

Official Communication issued in International Patent Application No. PCT/JP2016/083779, dated Feb. 7, 2017.

*Primary Examiner* — Hafizur Rahman
*Assistant Examiner* — Alan Wong
(74) *Attorney, Agent, or Firm* — Keating & Bennett, LLP (57) ABSTRACT

An elastic wave device includes an IDT electrode on a second main surface of an element substrate that includes a piezoelectric layer, a support layer on the second main surface and surrounding the IDT electrode, a cover member on the support layer, and routing wiring lines extending from the second main surface of the element substrate onto side surfaces of the element substrate.

20 Claims, 8 Drawing Sheets

(51) Int. Cl.
*H03H 9/145* (2006.01)
*H03H 9/64* (2006.01)

(56) References Cited

U.S. PATENT DOCUMENTS

| | | | | |
|---|---|---|---|---|
| 6,801,100 | B2 * | 10/2004 | Nakamura | H03H 9/0038 |
| | | | | 333/195 |
| 7,295,089 | B2 * | 11/2007 | Shibahara | H03H 9/009 |
| | | | | 333/195 |
| 7,391,090 | B2 * | 6/2008 | Picciotto | H05K 3/303 |
| | | | | 257/415 |
| 7,808,935 | B2 * | 10/2010 | Koga | H04B 1/0057 |
| | | | | 333/132 |
| 8,674,498 | B2 * | 3/2014 | Feiertag | B81B 7/007 |
| | | | | 257/710 |
| 8,963,655 | B2 * | 2/2015 | Ookubo | H03H 9/10 |
| | | | | 333/193 |
| 9,831,850 | B2 * | 11/2017 | Kuroyanagi | H03H 9/02559 |
| 10,680,159 | B2 * | 6/2020 | Metzger | H03H 9/0547 |
| 2002/0149295 | A1 | 10/2002 | Onishi et al. | |
| 2003/0071539 | A1 | 4/2003 | Kuratani et al. | |
| 2004/0196119 | A1 * | 10/2004 | Shibahara | H03H 9/14582 |
| | | | | 333/195 |
| 2009/0224851 | A1 | 9/2009 | Feiertag et al. | |
| 2014/0252916 | A1 | 9/2014 | Combe et al. | |
| 2015/0109071 | A1 | 4/2015 | Kikuchi et al. | |
| 2016/0301386 | A1 | 10/2016 | Iwamoto | |
| 2018/0013055 | A1 * | 1/2018 | Metzger | H01L 41/0533 |

FOREIGN PATENT DOCUMENTS

| | | |
|---|---|---|
| JP | 2008-546207 A | 12/2008 |
| JP | 2009-118504 A | 5/2009 |
| JP | 2009-159195 A | 7/2009 |
| JP | 2014-176089 A | 9/2014 |
| WO | 2014/034326 A1 | 3/2014 |
| WO | 2015/098792 A1 | 7/2015 |

* cited by examiner

ELASTIC WAVE DEVICE

CROSS REFERENCE TO RELATED APPLICATIONS

This application claims the benefit of priority to Japanese Patent Application No. 2015-248813 filed on Dec. 21, 2015 and is a Continuation Application of PCT Application No. PCT/JP2016/083779 filed on Nov. 15, 2016. The entire contents of each application are hereby incorporated herein by reference.

BACKGROUND OF THE INVENTION

1. Field of the Invention

The present invention relates to an elastic wave device having a WLP structure.

2. Description of the Related Art

Heretofore, elastic wave devices having a WLP structure have been widely used. Japanese Unexamined Patent Application Publication No. 2009-159195 discloses an elastic wave device having a WLP structure. In this elastic wave device, a functional electrode that includes an IDT electrode is provided on a piezoelectric substrate. In addition, a support layer is provided so as to surround the functional electrode and a cover member is provided so as to cover the support layer. Via conductors are formed in the piezoelectric substrate. An upper end of each via conductor is electrically connected to the functional electrode and a lower end of each via conductor is electrically connected to an outer electrode provided on a lower surface of the piezoelectric substrate.

When manufacturing the elastic wave device disclosed in Japanese Unexamined Patent Application Publication No. 2009-159195, it has been necessary to form through holes in the piezoelectric substrate in order to form the via conductors. Piezoelectric substrates are brittle and easily damaged. Therefore, the process of forming the through holes has been difficult. In addition, it has been difficult to adequately release heat generated in the IDT electrode using just the via conductors. Consequently, heat generated in the IDT electrode has tended to spread through the inside of the piezoelectric substrate and the temperature of the entire piezoelectric substrate has tended to increase. As described above, since the heat dissipating paths are not adequate, a heat dissipating characteristic of the piezoelectric substrate has been low.

SUMMARY OF THE INVENTION

Preferred embodiments of the present invention provide elastic wave devices that each are easy to manufacture and are able to effectively improve a heat dissipating characteristic of an element substrate.

An elastic wave device according to a preferred embodiment of the present invention is to be mounted on a mounting substrate. The elastic wave device includes an element substrate that includes a first main surface that is on a mounting substrate side thereof, a second main surface that faces the first main surface, and a side surface that connects the first main surface and the second main surface to each other, and that includes a piezoelectric layer; an IDT electrode that is provided on the second main surface of the element substrate; a support layer that is provided on the second main surface of the element substrate and surrounds the IDT electrode; a cover member that is provided on the support layer and seals, together with the support layer and the element substrate, the IDT electrode in a hollow space; and a routing wiring line that extends from the second main surface of the element substrate onto the side surface.

In an elastic wave device according to a preferred embodiment of the present invention, the routing wiring line extends from the second main surface onto the first main surface.

In an elastic wave device according to a preferred embodiment of the present invention, the routing wiring line is electrically connected to the IDT electrode.

In an elastic wave device according to a preferred embodiment of the present invention, the elastic wave device further includes a reflector, the reflector is provided on the second main surface of the element substrate, the support layer is provided on the second main surface of the element substrate and surrounds the IDT electrode and the reflector, and the routing wiring line is electrically connected to at least one of the IDT electrode and the reflector.

In an elastic wave device according to a preferred embodiment of the present invention, a plurality of the routing wiring lines are provided.

In an elastic wave device according to a preferred embodiment of the present invention, among the plurality of routing wiring lines, at least two routing wiring lines extend onto the first main surface of the element substrate and are connected to each other on the first main surface. In this case, the heat dissipating characteristic is able to be further improved.

In an elastic wave device according to a preferred embodiment of the present invention, a dimension of the routing wiring line in a width direction that is perpendicular or substantially perpendicular to a direction in which the routing wiring line is routed is larger than a largest outer dimension of the IDT electrode. In this case, the heat dissipating characteristic is able to be further improved.

In an elastic wave device according to a preferred embodiment of the present invention, the routing wiring line has a band shape. In this case, the heat dissipating characteristic is able to be more effectively improved.

In an elastic wave device according to a preferred embodiment of the present invention, among the plurality of routing wiring lines, routing wiring lines that are connected to different potentials are separated from each other by a gap therebetween on the side surface. In this case, short circuits between the routing wiring lines connected to different potentials are effectively prevented.

In an elastic wave device according to a preferred embodiment of the present invention, a plurality of the side surfaces are provided, and the routing wiring lines that are connected to the different potentials are separated from each other by the gap therebetween on a same side surface among the plurality of side surfaces. In this case, short circuits between the routing wiring lines connected to different potentials are effectively prevented.

In an elastic wave device according to a preferred embodiment of the present invention, a plurality of the side surfaces are provided, and the routing wiring lines that are connecting to the different potentials are provided on different side surfaces among the plurality of side surfaces. In this case, short circuits between the routing wiring lines connected to different potentials are effectively prevented.

In an elastic wave device according to a preferred embodiment of the present invention, one of the routing wiring lines covers the entire or substantially the entire side surface. In this case, the heat dissipating characteristic is able to be more effectively improved.

In an elastic wave device according to a preferred embodiment of the present invention, the second main surface side of the element substrate is narrower than the first main surface side of the element substrate in a dimension in a direction that connects a pair of the side surfaces that face each other.

In an elastic wave device according to a preferred embodiment of the present invention, the element substrate is a piezoelectric substrate including the piezoelectric layer.

In an elastic wave device according to a preferred embodiment of the present invention, the element substrate includes a support substrate made of an insulator or a semiconductor, and the piezoelectric layer is provided on the support substrate.

In an elastic wave device according to a preferred embodiment of the present invention, an insulating layer made of a resin is provided underneath the routing wiring line on the element substrate at an edge between at least one of the first and second main surfaces of the element substrate, and the side surface of the element substrate. In this case, a breakage is unlikely to occur in the routing wiring line at a corner portion.

In an elastic wave device according to a preferred embodiment of the present invention, the routing wiring line is made of one metal selected from a group consisting of Cu, Au, Pt, and W or an alloy having any one of these metals as a main component. In this case, further improvements are able to be achieved in terms of loss reduction and the heat dissipating characteristic.

In an elastic wave device according to a preferred embodiment of the present invention, the elastic wave device further includes capacitor electrodes defining a capacitor that are provided on the cover member.

In an elastic wave device according to a preferred embodiment of the present invention, the elastic wave device further includes an inductor provided on the cover member.

In an elastic wave device according to a preferred embodiment of the present invention, an LC circuit is provided that includes a capacitor, which includes the capacitor electrodes, and the inductor, which are electrically connected to each other. In this case, an LC circuit is integrated with the elastic wave device, and as a result, the characteristics are improved and the number of components is reduced.

In an elastic wave device according to a preferred embodiment of the present invention, the cover member is another element substrate including first and second main surfaces that face each other, another IDT electrode is provided on the second main surface of the other element substrate, and the first or second main surface of the another element substrate faces the second main surface of the element substrate via the hollow space.

In an elastic wave device according to a preferred embodiment of the present invention, the second main surface of the another element substrate faces the second main surface of the element substrate via the hollow space.

In an elastic wave device according to a preferred embodiment of the present invention, the first main surface of the another element substrate faces the second main surface of the element substrate via the hollow space, another support layer, which is different from the support layer, is provided on the second main surface of the another element substrate and surrounds the another IDT electrode, and another cover member is provided on the another support layer and seals, together with the another support layer and the another element substrate, the another IDT electrode in a hollow space.

Elastic wave devices according to preferred embodiments of the present invention are easy to manufacture and are able to effectively improve a heat dissipating characteristic of an element substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

Figure 1A:
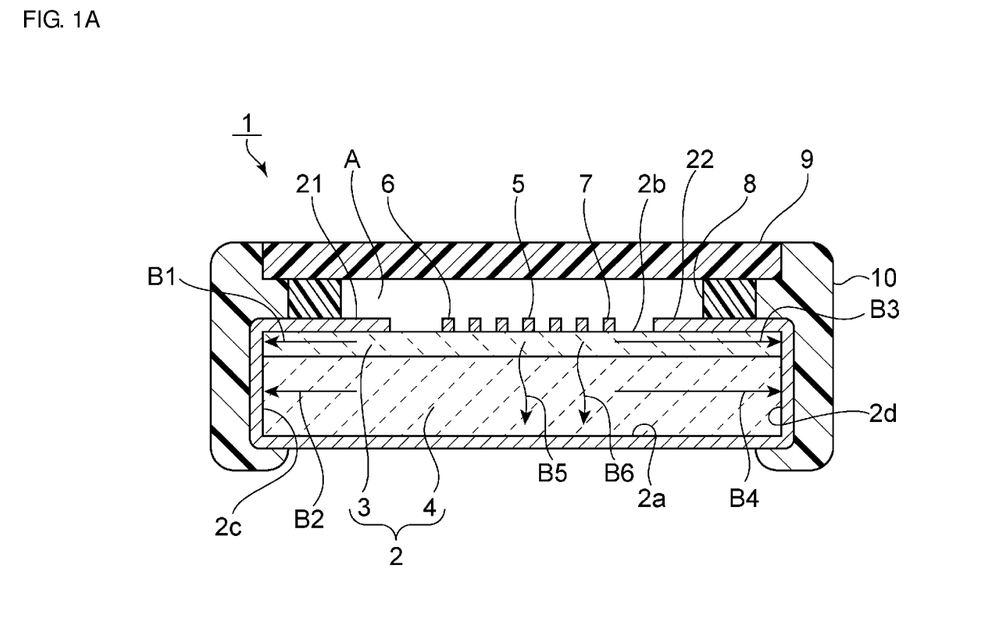
FIG. 1A is a front sectional view of an elastic wave device according to a first preferred embodiment of the present invention and FIG. 1B is a perspective view for describing the shapes of electrodes on a first main surface side of an element substrate of the elastic wave device of the first preferred embodiment of the present invention.
Figure 1B:
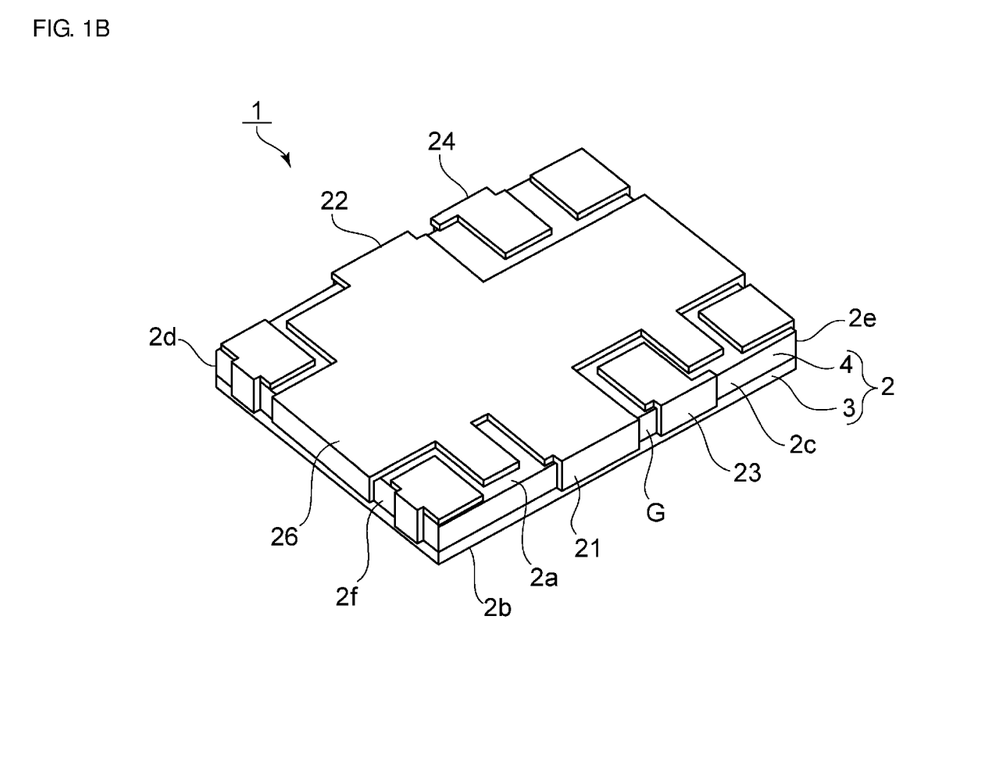
Figure 2:
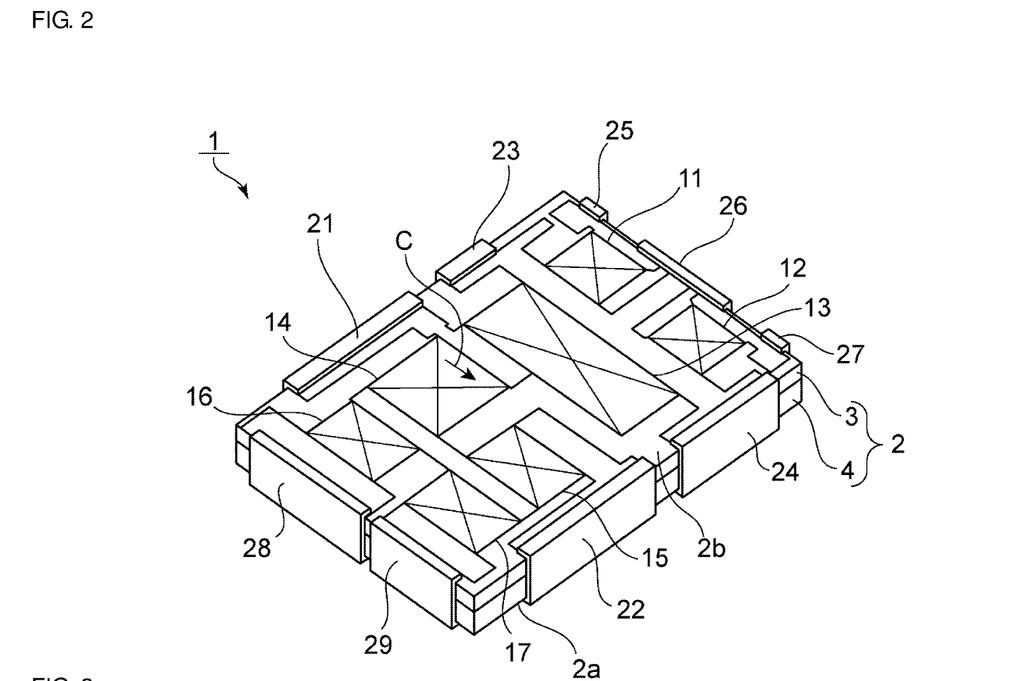
FIG. 2 is a perspective view for describing electrode structures provided on a second main surface of the element substrate in the elastic wave device of the first preferred embodiment of the present invention.

FIG. 1A is a front sectional view of an elastic wave device according to a first preferred embodiment of the present invention, FIG. 1B is a perspective view for describing electrode structures on a first main surface side of an element substrate used in the first preferred embodiment, and FIG. 2 is a perspective view for describing electrode structures on a second main surface of the element substrate.

An elastic wave device 1 includes an element substrate 2. The element substrate 2 includes first and second main surfaces 2a and 2b, which face each other. The element substrate 2 includes a piezoelectric layer 3 and a support substrate 4. The piezoelectric layer 3 is provided on the support substrate 4. Therefore, the upper surface of the piezoelectric layer 3 defines the second main surface 2b and the lower surface of the support substrate 4 defines the first main surface 2a. The first main surface 2a is a mounting-side main surface and the elastic wave device 1 is mounted on a mounting substrate, such as a circuit board, for example, from the first main surface 2a side.

The piezoelectric layer 3 is preferably made of a piezoelectric single crystal, such as $LiTaO_3$ or $LiNbO_3$ or a piezoelectric ceramic, for example. The support substrate 4 is preferably made of a suitable insulator or a semiconductor, for example. Si, $Al_2O_3$, and other suitable materials are examples of a material of the support substrate 4.

An IDT electrode 5 and reflectors 6 and 7, which are illustrated in FIG. 1A, are provided on the second main surface 2b of the element substrate 2.

In reality, as illustrated in FIG. 2, a plurality of elastic wave resonators 11 to 17 would be provided on the second main surface 2b in the elastic wave device 1. In FIG. 2, the elastic wave resonators 11 to 17 are illustrated in a schematic manner using a symbol consisting of an X surrounded by a rectangular frame. The elastic wave resonators 11 to 17 are preferably one-port elastic wave resonators, for example. The elastic wave resonators 11 to 17 each include the IDT electrode 5 and the reflectors 6 and 7 described above. In the present preferred embodiment, the elastic wave resonators 11 to 17 are electrically connected to each other and define a filter circuit, such as a ladder filter, for example.

In preferred embodiments of the present invention, the electrode structures on the second main surface 2b of the element substrate 2 are not particularly limited and do not need to include reflectors. It is sufficient that at least an IDT electrode that excites an elastic wave is provided.

The IDT electrode 5 and the reflectors 6 and 7 are preferably made of a suitable metal or alloy such as Al, Cu, or an AlCu alloy, for example. In addition, not limited to including a single metal film, the IDT electrode 5 and the reflectors 6 and 7 may include a multilayer metal film in which a plurality of metal films are stacked on top of one another.

A support layer 8 preferably surrounds the portion in which the IDT electrode 5 and the reflectors 6 and 7 are provided. The support layer 8 preferably has a rectangular or substantially rectangular frame shape. The support layer 8 is preferably made of a suitable insulating material, such as a composite resin, for example.

A flat-plate-shaped cover member 9 is mounted on the support layer 8. As a result, a hollow space A is provided. The IDT electrode 5 is located inside the hollow space A.

A molded resin layer 10 preferably covers side surfaces of a multilayer body including the element substrate 2, the support layer 8, and the cover member 9.

In the elastic wave device 1, routing wiring lines 21 and 22 are provided. As illustrated in FIG. 1A, a portion of each of the routing wiring lines 21 and 22 is located on the second main surface 2b of the element substrate 2. As illustrated in FIG. 1A and FIG. 2, the routing wiring line 21 extends from the second main surface 2b, across a side surface 2c, and onto the first main surface 2a. The routing wiring line 22 extends from the second main surface 2b, across a side surface 2d, and onto the first main surface 2a. As illustrated in FIGS. 1A and 1B, the routing wiring line 21 and the routing wiring line 22 are connected to each other on the first main surface 2a.

The reason why the routing wiring line 21 and the routing wiring line 22 are preferably connected to each other on the first main surface 2a is as follows. An IDT electrode 5 releases heat when an elastic wave device 1 operates. When the routing wiring lines are provided on the element substrate 2 to extend up to positions at which the routing wiring lines face a surface of the element substrate 2 on which the IDT electrode 5 is provided, heat dissipating paths along which heat generated by the IDT electrode is transferred to the routing wiring lines via the element substrate 2 become shorter, and therefore, the heat is able to be more efficiently released. Therefore, in the case in which the routing wiring line 21 and the routing wiring line 22 are connected to each other on the first main surface 2a, the routing wiring lines are disposed at positions that face the surface of the element substrate 2 on which the IDT electrode 5 is provided, and therefore, this configuration is preferable from the viewpoint of a heat dissipating characteristic. In addition, it is further preferable that routing wiring lines be at a ground potential from the viewpoint of the heat dissipating characteristic. In addition, even in the case in which the routing wiring line 21 and the routing wiring line 22 are not connected to each other on the first main surface 2a, as long as at least a portion of the routing wiring line 21 and a portion of the routing wiring line 22 are disposed at positions that face the surface of the element substrate 2 on which the IDT electrode 5 is provided, an advantageous effect is achieved from the viewpoint of the heat dissipating characteristic.

In addition to the routing wiring lines 21 and 22, a plurality of routing wiring lines 23 to 29 are provided.

The plurality of routing wiring line 21 to 29 extend from the second main surface 2b, across one of the side surfaces 2c, 2d, 2e, and 2f, and onto the first main surface 2a. The routing wiring lines 21 to 29 are preferably made of one metal selected from a group consisting of Cu, Au, Pt, and W or an alloy having any one of these metals as a main constituent, for example.

Among the routing wiring lines 21 and 22, the routing wiring line 21 is electrically connected to the reflectors and the grounds of the IDT electrodes of elastic wave resonators 13 and 14 illustrated in FIG. 2. The routing wiring line 22 is electrically connected to the reflectors and the ground of the IDT electrode of the elastic wave resonator 15. Furthermore, the routing wiring lines 21 and 22 are not particularly restricted and preferably have a band shape, for example. Preferably, the other routing wiring lines 23 to 29 also similarly have a band shape, for example. There is a high degree of freedom regarding the dimensions of the band shape, such as the width. Therefore, there is a high degree of freedom in terms of design.

In the present preferred embodiment, the routing wiring lines 21 and 22 extend from inside the hollow space A to outside the hollow space A on the second main surface 2b, extend across the side surface 2c or 2d, and onto the first main surface 2a. Thus, a heat dissipating characteristic is effectively improved.

When the elastic wave device 1 is driven, heat is primarily generated in the IDT electrode 5. Since the element substrate 2 does not have a particularly high thermal conductivity, it is difficult for the heat to dissipate. However, in the elastic wave device 1, taking the routing wiring lines 21 and 22 as examples, the routing wiring lines 21 and 22 are electrically connected to the IDT electrode, and therefore, the heat rapidly moves toward the first main surface 2a side via the band-shaped routing wiring lines 21 and 22. In addition, the heat generated in the IDT electrode 5 is also transferred to the piezoelectric layer 3 and the support substrate 4. Therefore, heat moves as indicated by arrows B1 to B6 in FIGS. 1A and 1B. In this case, since the band-shaped routing wiring lines 21 and 22 are provided, heat that has moved towards the side surfaces 2c and 2d and the first main surface 2a of the element substrate 2 rapidly moves to the routing wiring lines 21 and 22. Therefore, as compared to the case in which the routing wiring lines 21 and 22 do not extend onto the side surfaces 2c and 2d, the heat dissipating characteristic of the entire element substrate 2 is markedly improved.

In addition, in the elastic wave device disclosed in Japanese Unexamined Patent Application Publication No. 2009-159195, through holes had to be provided in a brittle piezoelectric substrate. Therefore, the processing was difficult.

In contrast, it is sufficient for the routing wiring lines 21 to 29 to extend from a surface of the element substrate 2 onto side surfaces of the element substrate 2. In order to further improve the heat dissipating characteristic, the routing wiring lines 21 to 29 may extend onto the first main surface 2a, which is the lower surface. Therefore, there is no need to perform troublesome through hole processing. Consequently, the elastic wave device 1 is easy to manufacture.

In addition, the IDT electrode 5 is provided on the second main surface 2b rather than the mounting-surface-side first main surface 2a. Therefore, the lengths of the routing wiring lines 21 to 29 are relatively short. Consequently, the heat dissipating characteristic is sufficiently high.

The routing wiring line 21 is connected to the ground potential. In addition, the routing wiring line 23 is connected to a signal potential. Therefore, the routing wiring line 21 and the routing wiring line 23 are connected to different potentials. The routing wiring line 21 and the routing wiring line 23 are arranged with a gap G therebetween on the side surface 2c. Therefore, short circuits between the routing wiring lines 21 and 23 are effectively reduced or prevented. In the present preferred embodiment, routing wiring lines that are connected to different potentials may be separated by a gap G on the same side surface 2c in this manner, for example.

In addition, routing wiring lines that are connected to different potentials may be arranged on different side surfaces as in the case of the routing wiring line 23 and the routing wiring line 26. In other words, among a plurality of routing wiring lines, routing wiring lines that are connected to different potentials may be separated by gaps on a plurality of side surfaces. The meaning of "on a plurality of side surfaces" also includes a configuration in which routing wiring lines that are arranged on not just one side surface but on two adjacent side surfaces, for example, are separated by a gap.

The routing wiring lines 21 to 29 preferably cover portions of the side surfaces 2c to 2f. Of course, the routing wiring lines may cover the entirety or substantially the entirety of at least one of the side surfaces 2c, 2d, 2e, and 2f. For example, the routing wiring line 26 illustrated in FIG. 1B may cover the entire side surface 2f. In this manner, the heat dissipating characteristics are further improved. In this case, it is sufficient that the routing wiring lines 23 and 24 extend across the side surface 2c or the side surface 2d onto the first main surface 2a.

In addition, in the elastic wave resonator 14, a direction indicated by arrow C in FIG. 2 is an elastic wave propagation direction and the electrode fingers of the IDT electrode 5 extend in a direction that is perpendicular or substantially perpendicular to the direction indicated by arrow C.

The routing wiring line 21 is provided at a position at which the routing wiring line 21 is superposed with the IDT electrode 5 of the elastic wave resonator 14 in the elastic wave propagation direction of the elastic wave resonator 14.

The routing wiring line 21 is preferably larger than the largest outer dimension of the IDT electrode of the elastic wave resonator 14. "The largest outer dimension of the IDT electrode" refers to the largest dimension of the IDT electrode among a dimension of the IDT electrode in the elastic wave propagation direction and a dimension of the IDT electrode in a direction that is perpendicular or substantially perpendicular to the elastic wave propagation direction. It is further preferable that a dimension W of the routing wiring line 21 in a width direction be larger than an outer dimension of the IDT electrode 5 in the direction in which the electrode fingers of the IDT electrode 5 of the elastic wave resonator 14 extend. "Dimension W in the width direction" refers to a dimension in a direction that is perpendicular or substantially perpendicular to a direction in which the routing wiring line 21 is routed. "Direction in which the routing wiring line is routed" refers to a routing direction in which the routing wiring line extends from the second main surface 2b, across the side surface 2c, and onto the first main surface 2a, as described above.

As described above, the width direction dimension W of the routing wiring line 21 is preferably larger than an outer dimension of the IDT electrode in the direction in which the electrode fingers of the IDT electrode extend. Therefore, heat generated at the peripheral edges of the IDT electrode 5 is able to be absorbed and the heat dissipating characteristic is further improved.

In addition, in FIG. 1A, since the routing wiring line 21 and the routing wiring line 22 are connected to each other on the first main surface 2a side of the element substrate 2, the heat dissipating characteristic is effectively improved. Of course, the routing wiring line 21 and the routing wiring line 22 do not need to be connected to each other on the first main surface 2a. In addition, although the plurality of routing wiring lines 21 to 29 extend onto the first main surface 2a, the plurality of routing wiring lines 21 to 29 do not need to extend onto the first main surface 2a. Even in such a case, heat transferred to the side surfaces 2c to 2f rapidly moves to the routing wiring lines 21 to 29. However, the plurality of routing wiring lines 21 to 29 are preferably provided to extend onto the first main surface 2a. In this manner, the heat dissipating characteristic is further improved.

Furthermore, although the routing wiring line 21 is electrically connected to the IDT electrode and the reflectors, it is sufficient that each of the routing wiring lines 21 to 29 be electrically connected to at least one of the reflectors and the IDT electrode. It is preferable that at least one routing wiring line among the routing wiring lines 21 to 29 be electrically connected to the corresponding IDT electrode. The IDT electrode is a heat-generating element, and therefore, the heat dissipating characteristic is able to be more effectively improved.

In the present preferred embodiment, the element substrate 2 has a structure in which the piezoelectric layer 3 is stacked on the support substrate 4. In this case, it is preferable that the support substrate 4 be made of a material having a higher thermal conductivity than the piezoelectric layer 3. Si or other suitable material is an example of such a material. In the case in which the thermal conductivity of the support substrate 4 is higher than the thermal conductivity of the piezoelectric layer 3, the heat dissipating characteristic is further improved.

Figure 3:
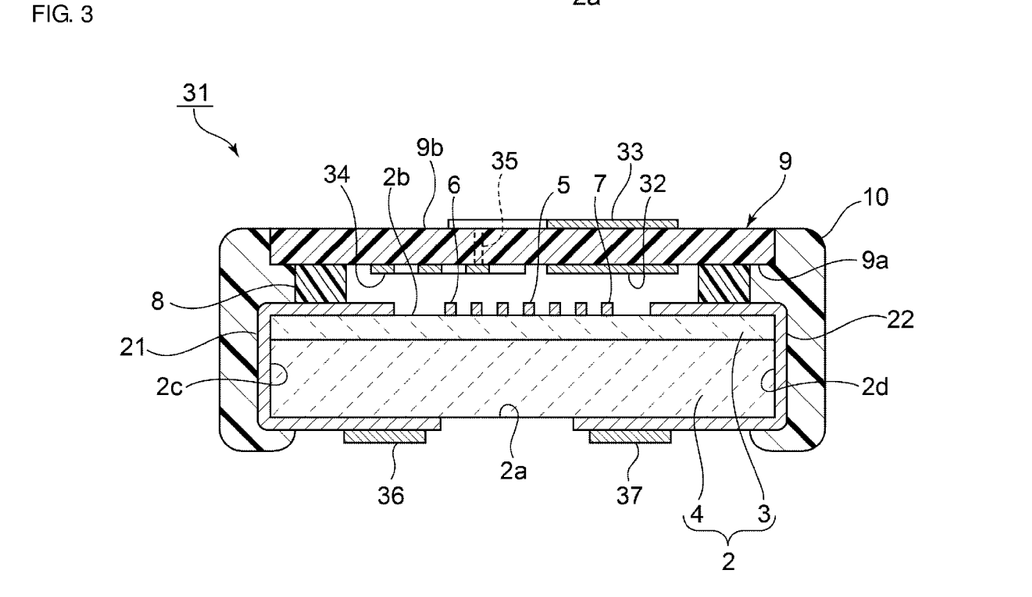
FIG. 3 is a front sectional view of an elastic wave device according to a second preferred embodiment of the present invention.

FIG. 3 is a front sectional view of an elastic wave device 31 according to a second preferred embodiment of the present invention. The elastic wave device 31 is the same or substantially the same as the elastic wave device 1 of the first preferred embodiment except that the elastic wave device 31 includes capacitor electrodes 32 and 33 and an inductor coil pattern 34 and in that the routing wiring lines 21 and 22 are not connected to each other on the first main surface 2a.

As illustrated in FIG. 3, the capacitor electrode 32 is provided on a lower surface 9a of the cover member 9. The capacitor electrode 33 is provided on an upper surface 9b of the cover member 9. The capacitor electrode 32 and the capacitor electrode 33 are preferably superposed with each other with the cover member 9 interposed therebetween. As a result, a capacitor is provided.

Figure 4:
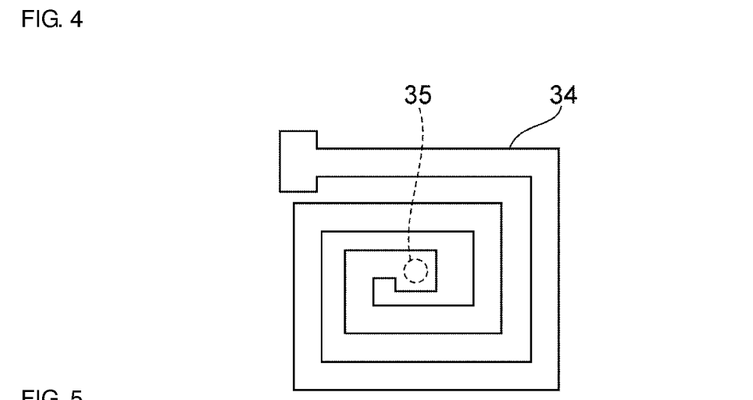
FIG. 4 is a plan view illustrating an inductor coil pattern provided on a cover member in the elastic wave device of the second preferred embodiment of the present invention.

The inductor coil pattern 34 illustrated in FIG. 4 is provided on the lower surface 9a of the cover member 9. The inductor coil pattern 34 is preferably made of a metal or an alloy such as Cu, for example. The inductor coil pattern 34 defines an inductor. The inductor coil pattern 34 is electrically connected to the capacitor electrode 33 by a via hole electrode 35. Thus, an LC circuit is provided on the cover member 9. This LC circuit is electrically connected to a functional electrode portion of the elastic wave device 31 including the IDT electrode 5. Thus, a capacitor and an inductor may be provided on the cover member 9. In addition, only one of the capacitor and the inductor may be provided on the cover member 9 instead.

In addition, an outer electrode 36 is provided on the routing wiring line 21 on the first main surface 2a. An outer electrode 37 is provided on the routing wiring line 22.

In the elastic wave device 31, a plurality of routing wiring lines including the routing wiring lines 21 and 22 extend from the second main surface 2b of the element substrate 2, across the side surface 2c, 2d, and so on, and onto the first main surface 2a. Therefore, similarly to the case of the elastic wave device of the first preferred embodiment, the heat dissipating characteristic is improved. In addition, the manufacturing process is easy.

Figure 5:
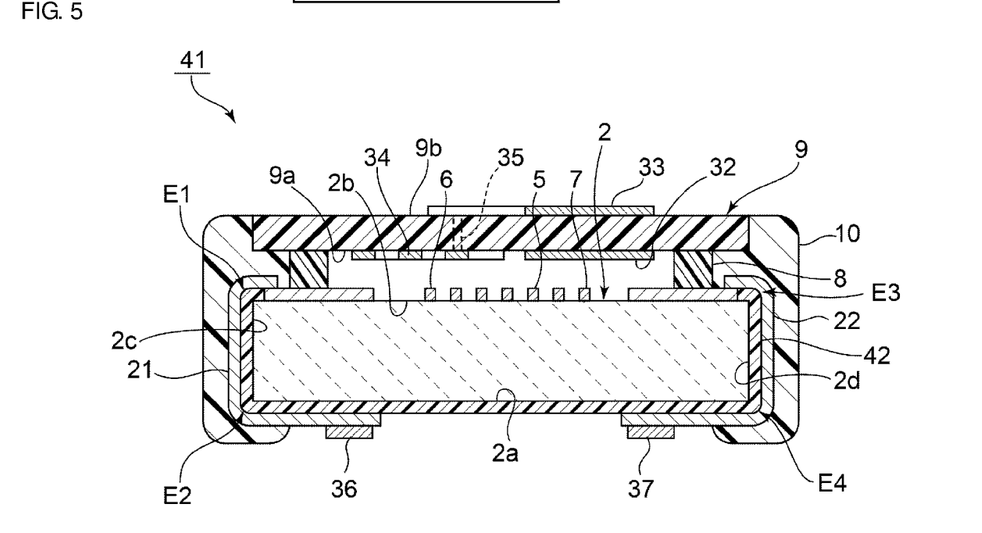
FIG. 5 is a front sectional view of an elastic wave device according to a third preferred embodiment of the present invention.

FIG. 5 is a front sectional view illustrating an elastic wave device 41 according to a third preferred embodiment of the present invention. The elastic wave device 41 includes an element substrate 2 preferably including only a piezoelectric layer. The element substrate 2 is preferably made of the same material as the piezoelectric layer 3 described above. Thus, in the present preferred embodiment, the element substrate 2 may include only a piezoelectric layer.

In the elastic wave device 41, an insulating layer 42 preferably extends from the second main surface 2b of the element substrate 2, across the side surfaces 2c and 2d, and onto the first main surface 2a. In addition, the routing wiring lines 21 and 22 are preferably stacked on the insulating layer 42. The insulating layer 42 is preferably made of a resin or an inorganic insulating material, for example. A suitable composite resin, such as an epoxy resin or a silicone resin, is an example of such a resin. Silicon oxide, silicon nitride, silicon oxynitride, alumina, tantalum oxide, and other suitable materials are examples of such an inorganic insulating material. The insulating layer 42 is provided as an underlayer for the routing wiring lines 21 and 22. In other words, the insulating layer 42 is provided between the routing wiring lines 21 and 22 and the element substrate 2. Then, in the case in which the insulating layer 42 is made of a resin, breakages are unlikely to occur in the routing wiring lines 21 and 22. This is because in the case in which the elastic wave device 41 is mounted on a mounting substrate or in the case in which heat acts on the elastic wave device 41, the element substrate 2 expands and contracts and, therefore, stress acts on the routing wiring lines 21 and 22. However, since resin is flexible, when the insulating layer 42, which is made of resin, is provided as an underlayer between the routing wiring lines 21 and 22 and the element substrate 2, stress acting on the routing wiring lines 21 and 22 is effectively reduced. In addition, since the locations at which the greatest stress acts on the routing wiring lines 21 and 22 are, for example, the corner portions in the cross section in FIG. 5 as indicated by arrows E1, E2, E3, and E4, it is preferable that the insulating layer 42 made of a resin is provided as an underlayer for the routing wiring lines 21 and 22 at the corner portions in the cross section in FIG. 5 as indicated by the arrows E1, E2, E3, and E4. Therefore, it is preferable that the insulating layer 42 made of a resin is provided as an underlayer for the routing wiring lines 21 and 22 at the edges between the second main surface 2b or the first main surface 2a and the side surfaces 2c to 2f.

The elastic wave device 41 is the same or substantially the same as the elastic wave device 31 in all other respects. Therefore, the same elements are denoted by the same reference symbols and description thereof is omitted. Since a plurality of routing wiring lines including the routing wiring lines 21 and 22 are provided in the elastic wave device 41, the heat dissipating paths are increased and, therefore, the heat dissipating characteristic is effectively improved. In addition, there is no need to provide through holes and, therefore, the manufacturing process is also easy.

Figure 11:
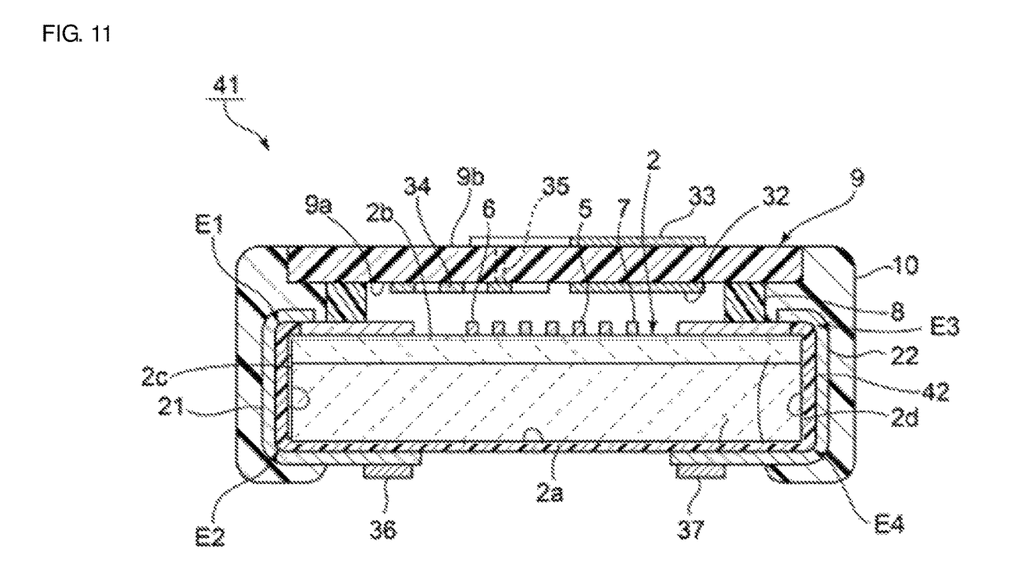
FIG. 11 is a front sectional view of an elastic wave device according to a modification of the third preferred embodiment of the present invention.

FIG. 11 is a front sectional view illustrating a modification of the third preferred embodiment of the present invention. The modification of the third preferred embodiment differs from the third preferred embodiment in that the element substrate 2 includes the support substrate 4. The modification is the same or substantially the same as the third preferred embodiment in all other respects. In the case in which the support substrate 4 of the elastic wave device 41 includes a substrate having conductivity, such as a silicon substrate, a leakage current is undesirably generated between the routing wiring line 21 and the routing wiring line 22 via the support substrate 4 and the characteristics of the elastic wave device 41 are undesirably degraded. Consequently, it is preferable to provide an insulating layer 42 made of an inorganic insulating material as an underlayer between the routing wiring lines 21 and 22 and the support substrate 4. As described above, silicon oxide, silicon nitride, silicon oxynitride, alumina, tantalum oxide, and other suitable materials are examples of such an inorganic insulating material.

Figure 6:
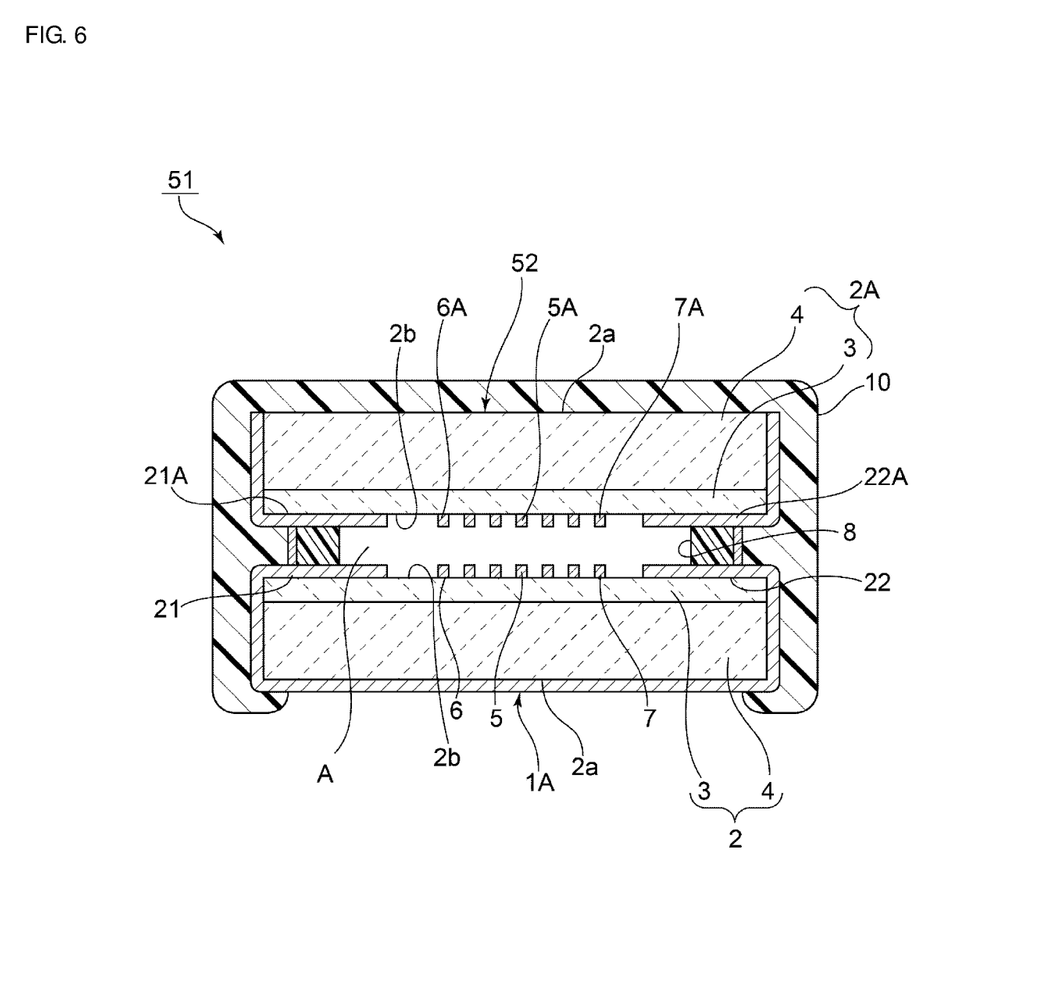
FIG. 6 is a front sectional view of an elastic wave device according to a fourth preferred embodiment of the present invention.

FIG. 6 is a front sectional view of an elastic wave device 51 according to a fourth preferred embodiment of the present invention.

The elastic wave device 51 includes an elastic wave device 1A, which is obtained by removing the cover member 9 from the elastic wave device 1 illustrated in FIGS. 1A and 1B. An elastic wave device 52 is arranged on the elastic wave device 1A. The elastic wave device 52 corresponds to a cover member of the elastic wave device 1A. A plurality of elastic wave devices may be stacked on top of one another as in the present preferred embodiment.

As illustrated in FIG. 6, the elastic wave device 52 preferably has the same or substantially the same structure as the elastic wave device 1A. The elastic wave device 52 is vertically inverted with respect to the elastic wave device 1A. Therefore, the second main surfaces 2b face each other in the hollow space A.

In the elastic wave device 52, an IDT electrode 5A and reflectors 6A and 7A are provided on another element substrate 2A, which is different from the element substrate 2.

Furthermore, the elastic wave device 52 includes routing wiring lines 21A and 22A. The routing wiring lines 21A and 22A extend from the second main surface 2b onto the side surfaces 2c and 2d, but do not extend onto the first main surface 2a. The remaining configuration of the elastic wave device 52 is the same or substantially the same as that of the elastic wave device 1A.

In addition, the plurality of routing wiring lines of the elastic wave device 52 including the routing wiring lines 21A and 22A are electrically connected, as appropriate, to the plurality of routing wiring lines 21, 22 of the elastic wave device 1A. Consequently, the elastic wave device 1A and the elastic wave device 52 are electrically connected to each other and a filter circuit or other suitable circuit is thus provided.

Since the elastic wave device 1A has the same or substantially the same configuration as the elastic wave device 1, the elastic wave device 51 has an excellent heat dissipating characteristic and is easy to manufacture. Furthermore, the elastic wave device 52, which is stacked to define a cover member, also includes a plurality of routing wiring lines including the routing wiring lines 21A and 22A, and therefore, the elastic wave device 52 similarly has an excellent heat dissipating characteristic. In addition, since there is no need to perform through hole processing, the manufacturing process is easy.

In addition, in the elastic wave device 51, similarly to as in the elastic wave device 1, the element substrates 2 and 2A are each preferably defined by a multilayer body including the support substrate 4 and the piezoelectric layer 3. In this case as well, the element substrates 2 and 2A may, instead, be defined by only a piezoelectric layer.

Figure 7:
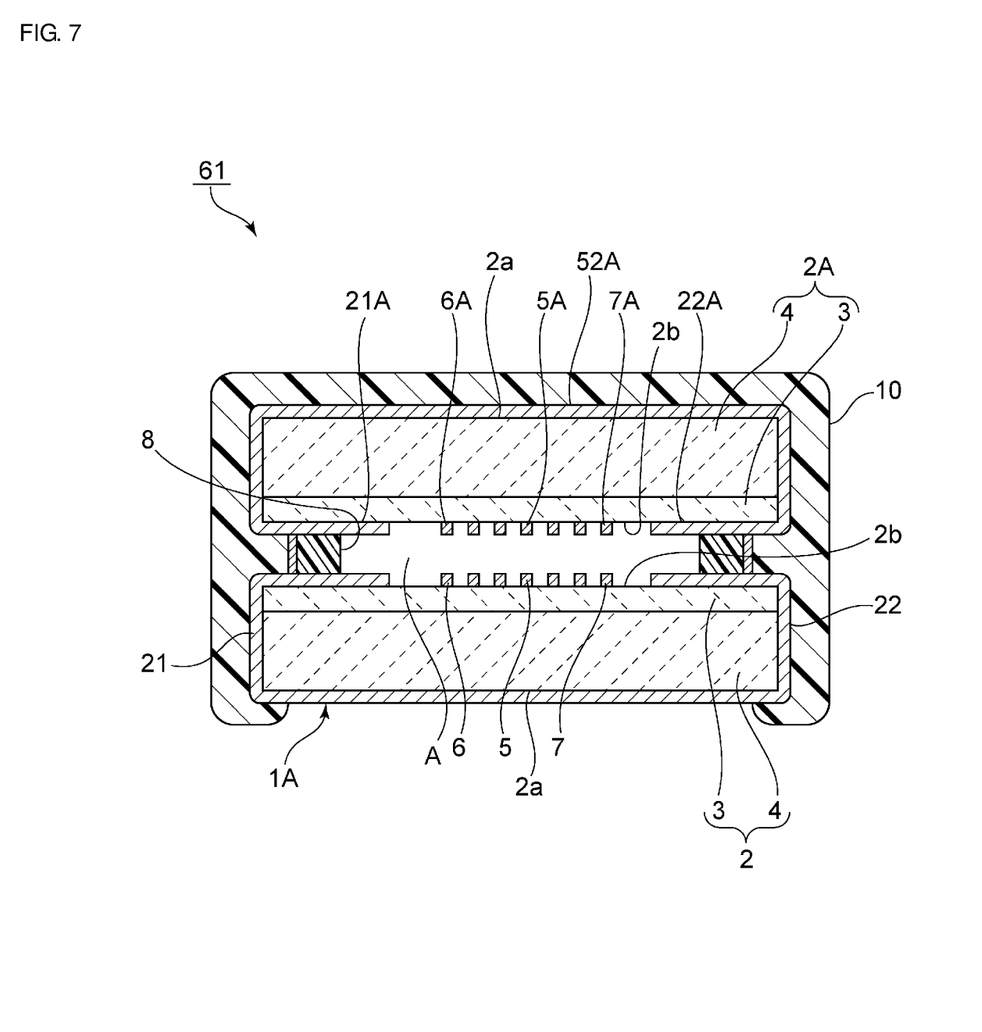
FIG. 7 is a front sectional view of an elastic wave device according to a fifth preferred embodiment of the present invention.

FIG. 7 is a front sectional view of an elastic wave device 61 according to a fifth preferred embodiment of the present invention. In the elastic wave device 61, the routing wiring lines 21A and 22A are connected to each other on the first main surface 2a. The remaining configuration of the elastic wave device 61 is the same or substantially the same as that of the elastic wave device 51. Thus, in an elastic wave device 52A, which is stacked to define a cover member, a plurality of routing wiring lines 21A and 22A may be connected to each other on the first main surface 2a, and in this case, the heat dissipating characteristic is further improved.

Figure 8:
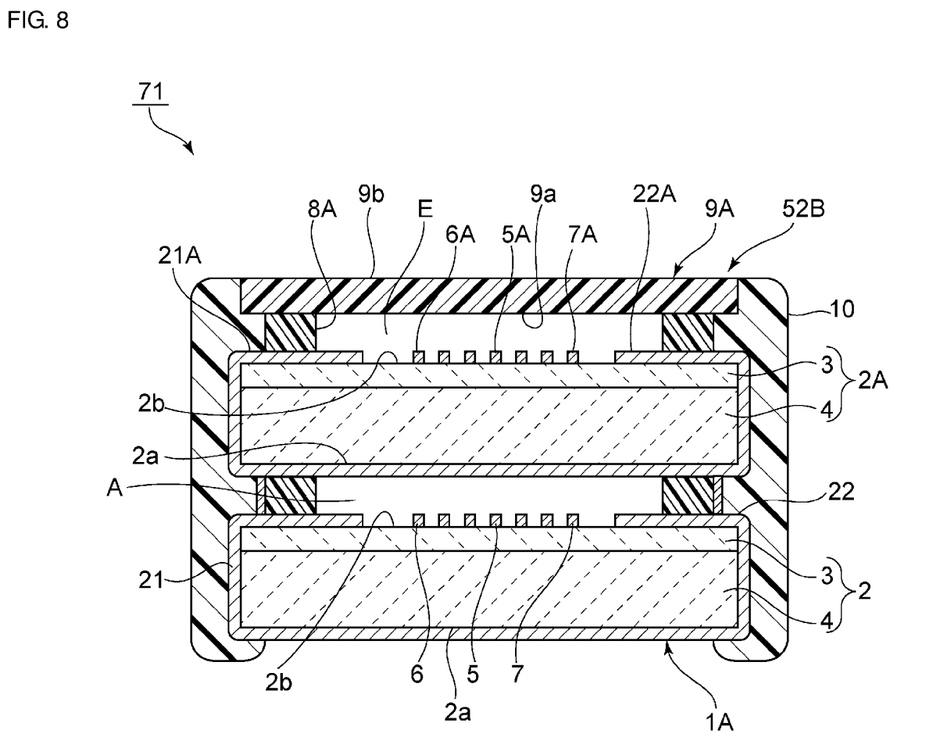
FIG. 8 is a front sectional view of an elastic wave device according to a sixth preferred embodiment of the present invention.

FIG. 8 is a front sectional view of an elastic wave device 71 according to a sixth preferred embodiment of the present invention. In the elastic wave device 71, an elastic wave device 52B is stacked above the elastic wave device 1A, instead of a cover member. In contrast to the elastic wave device 51, in the elastic wave device 71, the first main surface 2a in the elastic wave device 52B faces the second main surface 2b in the elastic wave device 1A. In other words, the vertical orientation of the elastic wave device 52B is the same as the vertical orientation of the elastic wave device 1A. Consequently, a support layer 8A and a cover member 9A are provided on the second main surface 2b in the elastic wave device 52B. Thus, a hollow space E is provided.

Since the elastic wave device 52B includes a plurality of routing wiring lines 21A and 22A, similarly to the elastic wave devices 51 and 61, the elastic wave device 71 is able to effectively improve the heat dissipating characteristic in both of the elastic wave device 1A and the elastic wave device 52B. In addition, there is no need to provide through holes and, therefore, the manufacturing process is also easy.

Figure 9:
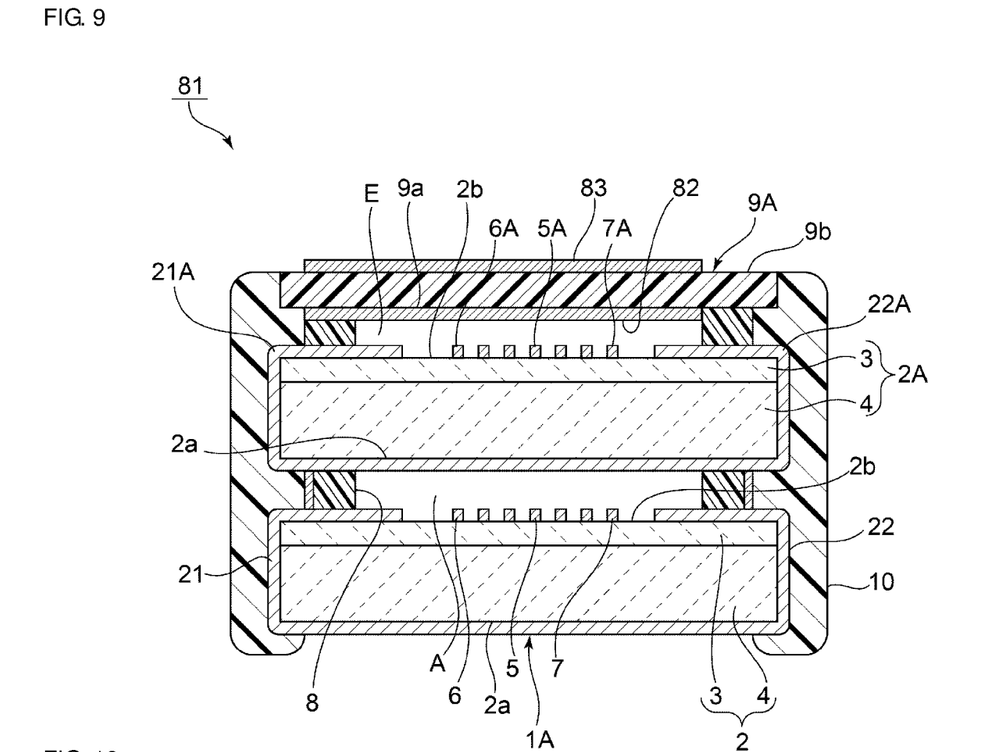
FIG. 9 is a front sectional view of an elastic wave device according to a seventh preferred embodiment of the present invention.

FIG. 9 is a front sectional view of an elastic wave device 81 according to a seventh preferred embodiment of the present invention. In the present preferred embodiment, capacitor electrodes 82 and 83 are provided on the lower surface 9a and the upper surface 9b of the cover member 9A. A capacitor is defined by the capacitor electrodes 82 and 83. The remaining configuration of the elastic wave device 81 is the same or substantially the same as that of the elastic wave device 71. Therefore, the heat dissipating characteristic is improved in the elastic wave device 81. In addition, the manufacturing process is also easy.

Furthermore, other elements such as the inductor described above may be provided by utilizing the cover member 9A in the elastic wave device 81.

Figure 10:
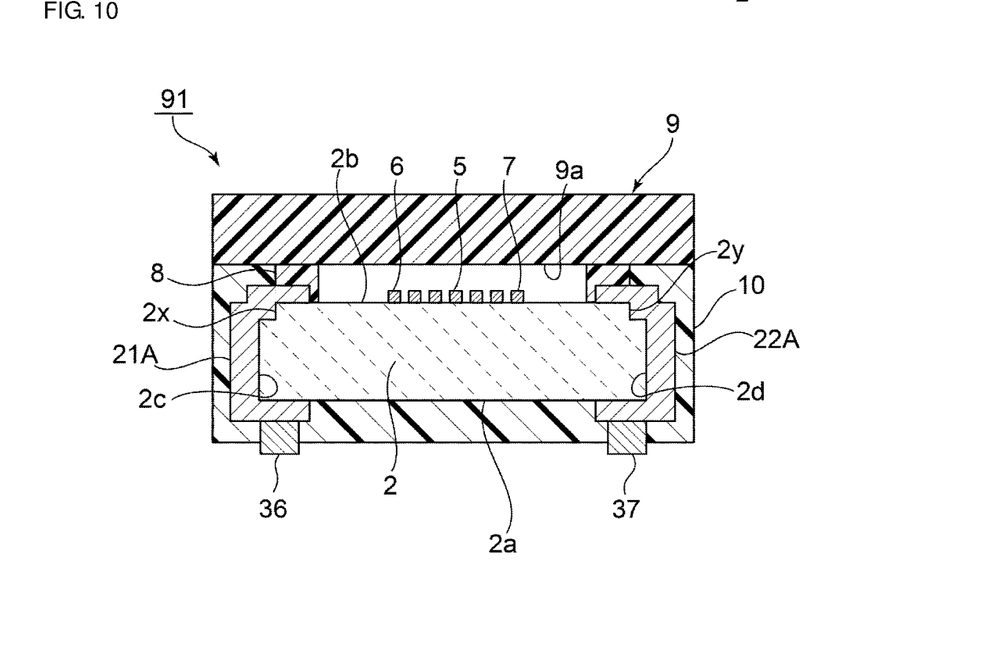
FIG. 10 is a front sectional view of an elastic wave device according to an eighth preferred embodiment of the present invention.

FIG. 10 is a front sectional view of an elastic wave device 91 according to an eighth preferred embodiment of the present invention. The elastic wave device 91 according the eighth preferred embodiment includes an element substrate 2 defined by a piezoelectric body. A level difference is provided on the second main surface 2b side of the element substrate 2. In other words, a direction that connects the side surface 2c and the side surface 2d that faces the side surface 2c to each other is denoted as a width direction. The width direction dimension, that is, the width is smaller on the second main surface 2b side than on the first main surface 2a side. More specifically, level differences 2x and 2y are provided on the outer sides in the width direction. Thus, portions having a relatively smaller width are provided on the second main surface 2b side.

In addition, in the present preferred embodiment, although the element substrate 2 defined by a piezoelectric body is provided, an element substrate in which a piezoelectric layer is provided on a support substrate may be used, instead, as in the first preferred embodiment described above. In this case, the level differences 2x and 2y may be provided in the piezoelectric layer and may extend to the support substrate below the piezoelectric layer.

The other portions and elements of the elastic wave device 91 are the same or substantially the same as those of the elastic wave device 1 of the first preferred embodiment, and therefore, the same portions and elements are denoted by the same reference symbols and reference should be made to the description given in the first preferred embodiment. Although the cover member 9 covers the upper surface of the molded resin layer 10 in the present preferred embodiment, the present invention is not limited to this configuration. The molded resin layer 10 may extend onto side surfaces of the cover member 9.

As described above, the method of providing the element substrate 2 with portions having a relatively small width is not particularly limited. For example, there is a method in which cutting with a dicing machine is performed twice when a collective board is divided into individual element substrates 2. First, cutting is performed using the dicing machine a first time in order to divide the collective board into individual element substrates. Then, shallow cutting is performed using the dicing machine using a blade having a larger width than the blade used when performing the cutting the first time. Thus, the level differences 2x and 2y are provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device that is to be mounted on a mounting substrate, the elastic wave device comprising:
   an element substrate including a first main surface that is on a mounting substrate side thereof, a second main surface that faces the first main surface, a plurality of side surfaces, including a first side surface, a second side surface, a third side surface, and a fourth side surface, that connect the first main surface and the second main surface to each other, and a piezoelectric layer;

an IDT electrode provided on the second main surface of the element substrate;

a support layer provided on the second main surface of the element substrate to surround the IDT electrode;

a cover member provided on the support layer and sealing, together with the support layer and the element substrate, the IDT electrode in a hollow space; and a plurality of routing wiring lines including a first routing wiring line that extends from the second main surface of the element substrate onto the first side surface, a second routing wiring line that extends from the second main surface of the element substrate onto the second side surface, a third routing wiring line that extends from the second main surface of the element substrate onto the third side surface, and a fourth routing wiring line that extends from the second main surface of the element substrate onto the fourth side surface; wherein the first, second, third, and fourth routing wiring lines extend from the second main surface across the first, second, third, and fourth side surfaces, respectively, onto the first main surface of the element substrate and are connected to each other on the first main surface.

2. The elastic wave device according to claim 1, wherein at least one of the first and second routing wiring lines is electrically connected to the IDT electrode.

3. The elastic wave device according to claim 1, further comprising:
a reflector; wherein
the reflector is provided on the second main surface of the element substrate;
the support layer is provided on the second main surface of the element substrate to surround the IDT electrode and the reflector; and
at least one of the first and second routing wiring lines is electrically connected to at least one of the IDT electrode and the reflector.

4. The elastic wave device according to claim 1, wherein a dimension of at least one of the first and second routing wiring lines in a width direction that is perpendicular or substantially perpendicular to a direction in which the at least one of the first and second routing wiring lines is routed is larger than a largest outer dimension of the IDT electrode.

5. The elastic wave device according to claim 1, wherein at least one of the first and second routing wiring lines has a band shape.

6. The elastic wave device according to claim 1, wherein among the plurality of routing wiring lines, routing wiring lines that are connected to different potentials are separated from each other by a gap therebetween on at least one of the plurality of side surfaces.

7. The elastic wave device according to claim 6, wherein the routing wiring lines that are connected to the different potentials are separated from each other by the gap therebetween on a same side surface among the plurality of side surfaces.

8. The elastic wave device according to claim 6, wherein the routing wiring lines that are connected to the different potentials are provided on different side surfaces among the plurality of side surfaces.

9. The elastic wave device according to claim 1, wherein one of the routing wiring lines covers an entirety or substantially an entirety of the side surface.

10. The elastic wave device according to claim 1, wherein the plurality of side surfaces include a pair of side surfaces that face each other; and
the second main surface side of the element substrate is narrower than the first main surface side of the element substrate in a direction that connects the pair of the side surfaces that face each other.

11. The elastic wave device according to claim 1, wherein the element substrate is a piezoelectric substrate made of the piezoelectric layer.

12. The elastic wave device according to claim 1, wherein the element substrate includes a support substrate made of an insulator or a semiconductor and the piezoelectric layer that is provided on the support substrate.

13. The elastic wave device according to claim 1, wherein an insulating layer is provided underneath at least one of the first and second routing wiring lines on the element substrate at an edge between at least one of the first and second main surfaces of the element substrate, and the corresponding one of the plurality of side surfaces of the element substrate.

14. The elastic wave device according to claim 1, wherein at least one of the first and second routing wiring lines is made of one metal selected from the group consisting of Cu, Au, Pt, and W, or an alloy including any one of Cu, Au, Pt, and W as a main component.

15. The elastic wave device according to claim 1, further comprising capacitor electrodes that define a capacitor and are provided on the cover member.

16. The elastic wave device according to claim 1, further comprising an inductor provided on the cover member.

17. The elastic wave device according to claim 16, wherein an LC circuit is provided and includes a capacitor, which includes capacitor electrodes, and the inductor, and the capacitor and the inductor are electrically connected to each other.

18. The elastic wave device according to claim 1, wherein the cover member is another element substrate;
the another element substrate includes first and second main surfaces that face each other;
another IDT electrode is provided on the second main surface of the another element substrate; and
the first or second main surface of the another element substrate faces the second main surface of the element substrate via the hollow space.

19. The elastic wave device according to claim 18, wherein the second main surface of the another element substrate faces the second main surface of the element substrate via the hollow space.

20. The elastic wave device according to claim 18, wherein
the first main surface of the another element substrate faces the second main surface of the element substrate via the hollow space;
another support layer is provided on the second main surface of the another element substrate to surround the another IDT electrode; and
another cover member is provided on the another support layer and seals, together with the another support layer and the another element substrate, the another IDT electrode in a hollow space.

* * * * *